(12) United States Patent
Choi et al.

(10) Patent No.: US 6,432,766 B1
(45) Date of Patent: Aug. 13, 2002

(54) METHOD OF FABRICATING A SRAM DEVICE

(75) Inventors: Bo Kyung Choi, Kyoungsangbuk-do; Young Mo Lee; Jeong Kweon Park, both of Chungcheongbuk-do, all of (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 09/895,874

(22) Filed: Jul. 2, 2001

(30) Foreign Application Priority Data

Jun. 30, 2000 (KR) ........................................ 2000-37370

(51) Int. Cl.$^7$ ........................................ H01L 21/8244
(52) U.S. Cl. ........................ 438/238; 438/383; 438/384; 438/385
(58) Field of Search ................... 438/238, 383, 438/384, 385

(56) References Cited

U.S. PATENT DOCUMENTS

| | | | | |
|---|---|---|---|---|
| 6,245,611 B1 | * | 6/2001 | Hahsimoto et al. | 438/238 |
| 6,255,151 B1 | * | 7/2001 | Fukuda et al. | 438/197 |
| 6,258,649 B1 | * | 7/2001 | Nakamura et al. | 438/238 |
| 6,171,898 B1 | * | 1/2002 | Crenshaw et al. | 438/240 |
| 6,342,416 B1 | * | 1/2002 | Kim et al. | 438/239 |

* cited by examiner

Primary Examiner—Long Pham
(74) Attorney, Agent, or Firm—Pillsbury Winthrop LLP

(57) ABSTRACT

The present invention comprises an improved method of forming the source voltage lines, connection lines, and high load resistors for use in HLR SRAM devices. The source voltage lines, connection lines, and high load resistors are formed from a single polysilicon film that is selectively silicided to produce the low resistance structures while preserving the as-deposited polysilicon resistivity for formation of the high load resistor. The improved resistance control allows reduced feature size and increased pattern density.

7 Claims, 3 Drawing Sheets

METHOD OF FABRICATING A SRAM DEVICE

BACKGROUND OF THE INVENTION

1. Field of the Invention

The present invention relates generally to a method of fabricating SRAM devices and, more particularly, to a method of forming a contact of a SRAM device which exhibits reduced contact resistance.

2. Description of Related Art

Generally, semiconductor memory devices are broadly classified into DRAM (Dynamic Random Access Memory) and SRAM (Static Random Access Memory) according to their memory mode.

SRAMs are widely used memory devices, which may be driven at high speed while providing low power consumption and simple operation. Moreover, SRAMs, unlike DRAMs, do not require that the stored information be periodically refreshed and are relatively easy to design.

SRAM cells are typically composed of two pull-down devices (hereinafter referred to as drive transistors), two access devices (access transistors) and two pull-up devices. Depending on the construction of the pull-up devices, these SRAM cells may be classified into three main types, a full CMOS type, a High Load Resistor (HLR) type and a Thin Film Transistor (TFT) type.

The full CMOS type cell employs a P-channel bulk MOSFET as the pull-up device, the HLR type cell employs a polysilicon layer, and the TFT type cell employs a P-channel polysilicon TFT.

A conventional method of fabricating a HLR type SRAM device will now be schematically described with reference to FIG. 1 which is a cross-sectional view showing a HLR type SRAM device.

Referring to FIG. 1, the conventional method for fabricating the HLR type SRAM device includes forming a gate insulating film 3 on a semiconductor substrate 1 having a field oxide film 2 providing isolation between adjacent devices. Using known deposition techniques, a first polysilicon film is deposited on the gate insulating film.

Then, the first polysilicon film is patterned and etched to form a gate electrode 4A of an access transistor and a gate electrode 4B of a drive transistor.

Next, spacers 5 are formed on both sidewalls of the respective gate electrodes 4A and 4B, and impurity ions are implanted into the semiconductor substrate 1 at both sides of the gate electrodes 4A and 4B to form the source 6A and drain 6B regions of the transistors.

In FIG. 1, the source region 6A is a common connection node to which the access transistor, the drive transistor and a high load resistor (not shown) are connected, and the drain region 6B is a region to which a bit line is connected.

After this, a first interlayer insulating film 7 is deposited on the resulting substrate. The first interlayer insulating film is then partially etched so as to expose the drain region 6B of the access transistor.

A second polysilicon film is then deposited in such a manner that it is in contact with the exposed drain region 6B. The second polysilicon film is then patterned and etched to form a bit contact buffer region 8.

Afterwards, a second interlayer insulating film 9 is formed on the bit contact buffer region 8 and the first interlayer insulating film 7, after which the first and second interlayer insulating films 7 and 9 are etched in such a manner that the source region 6A, i.e., the common node of the drive transistor and the access transistor, is exposed. As a result, a contact hole 9A is formed. When forming the contact hole H, the gate electrode 4B of the drive transistor is partially exposed.

Next, an undoped third polysilicon film 10 is deposited on the second interlayer insulating film 9 in such a manner that it contacts both the exposed source region 6A and the gate electrode 4B of the drive transistor.

Following this, the third polysilicon film 10 is patterned, and impurity ions are implanted into the majority of the third polysilicon film, e.g., that portion of the film that will provide the connection lines between the devices, thereby forming a source voltage line 10A, an undoped high load resistor portion 10B and a connection line 10C.

However, the conventional method of fabricating the SRAM device suffers from certain problems. For example, in the conventional method described above, the source voltage line, the high load resistor portion and the connection line are formed by depositing an undoped polysilicon film and then selectively implanting impurity ions into selected portions of the polysilicon film corresponding to the source voltage line and the connection line.

After the above ion implantation is complete, a heat treatment is carried out to activate the implanted ions. As a result of this heat treatment, the final resistance value becomes smaller than the designed resistance value.

In addition, because the diffusion length is a direct function of the heat treatment temperature and duration, there is a limit to how much the width of the resistor may be reduced in order to increase the integration density.

SUMMARY OF THE INVENTION

It is therefore an object of the present invention to solve the problems with the prior art and to provide a method of fabricating a SRAM device, which includes forming the source voltage lines and connection lines using a silicide process and thus forming source voltage and connection lines having lower resistance.

To achieve the above object, the present invention provides a method of fabricating a SRAM device, comprising the steps of: providing a semiconductor substrate having a field oxide film and a first polysilicon film; patterning the polysilicon film to form a gate electrode for an access transistor and a gate electrode for a drive transistor; implanting an impurity into the substrate at both sides of the respective gate electrodes to form source and drain regions; forming a silicide film on the source region of the access transistor; forming a first interlayer insulating film on the resulting semiconductor substrate; patterning the first interlayer insulating film in such a manner that a portion of the drain region of the access transistor and a portion of the source region, i.e., the portion that serves as a common node for the drive transistor and the access transistor, are exposed; depositing a second polysilicon film on the resulting semiconductor substrate; polishing the second polysilicon film using a chemical mechanical polishing (CMP) process to expose the first interlayer insulating film, thereby forming a polysilicon plug and a bit contact buffer region; forming a second interlayer insulating film on the semiconductor substrate on which the polysilicon plug and the bit contact buffer region were formed; patterning the second interlayer insulating film so as to expose the polysilicon plug; forming a third polysilicon film on the patterned second interlayer insulating film; depositing an insulating film on the third polysilicon film and patterning the insulating film in such a manner that those portions of the third polysilicon film intended for the source voltage lines and connection lines are exposed; and forming a metal thin film on the exposed portions of the third polysilicon film and thermally treating the resulting substrate to form the source voltage lines and the connection lines.

BRIEF DESCRIPTION OF THE DRAWINGS

The above and other objects and aspects of the invention will be apparent from the following description of embodiments with reference to the accompanying drawings, in which.

DETAILED DESCRIPTION

A method of fabricating a SRAM device according to the present invention will now be described in detail with reference to the accompanying drawings.

FIG. 2A to FIG. 2E are cross-sectional views for describing a method of fabricating a SRAM device according to the present invention.

Figure 1:
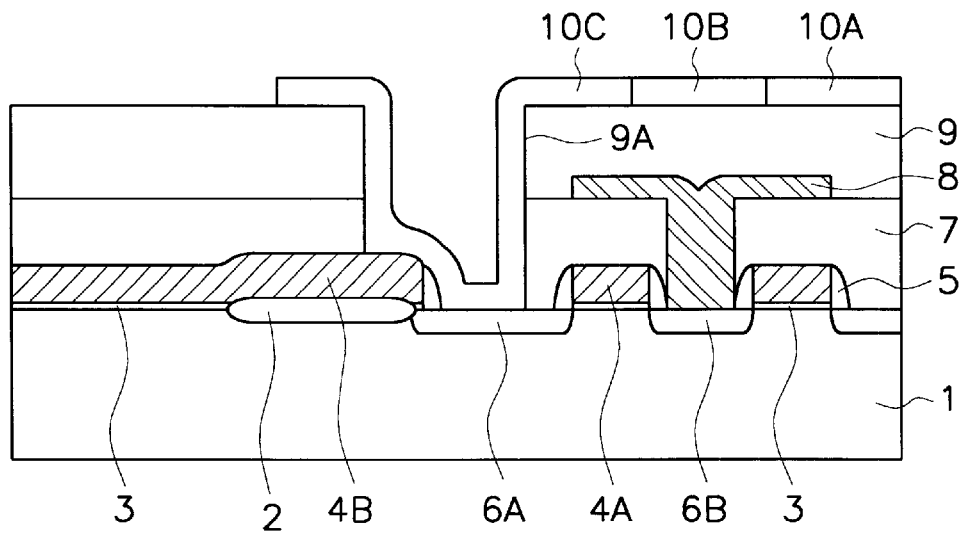
FIG. 1 is a cross-sectional view for describing a method of fabricating a SRAM device according to the prior art.
Figure 2A:
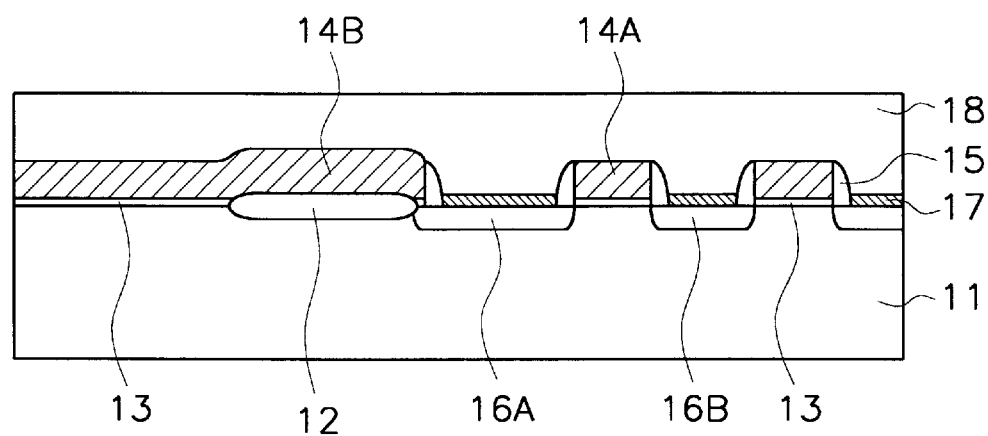
FIG. 2A to FIG. 2E are cross-sectional views for describing a method of fabricating a SRAM device according to the present invention.

Referring to FIG. 2A, a field oxide film 12 is first formed on a desired portion of a semiconductor substrate 11 by a known LOCOS oxidation technique.

Then, a gate insulating film 13 and a first polysilicon film are deposited on the substrate 11 and patterned and etched to form a gate electrode 14A of an access transistor and a gate electrode 14B of a drive transistor.

Next, impurity ions are implanted into the substrate 11 at both sides of the respective gate electrodes 14A and 14B to form source 16A and drain regions 16B for the access and drive transistors.

A silicide film 17 is then formed on the source/drain regions in a conventional manner, and a first interlayer insulating film 18 is formed on the resulting substrate. At this time, the silicide film 17 serves to prevent additional doping of impurities in subsequent processes. In the Figures, the reference numeral 16A designates a common connection node, i.e., the source region for both the access transistor and the drive transistor. Also, the reference numeral 16B designates the drain region of the access transistor.

Figure 2B:
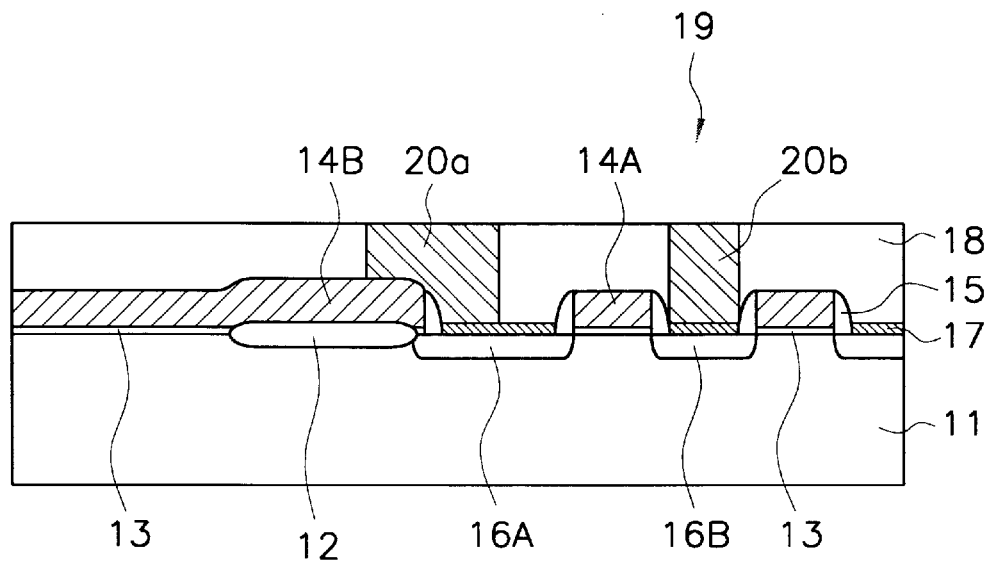

As shown in FIG. 2B, the first interlayer insulating film 18 is patterned and etched to expose the drain region 16B and a portion of the common source region 16A. As a result, a contact hole 19 is formed.

Next, a highly doped second polysilicon film is then formed on the substrate and fills contact hole 19. The majority of the second polysilicon film is then removed by a chemical mechanical polishing (CMP) process to expose the first interlayer insulating film 18, thereby forming a polysilicon plug 20a and a bit contact buffer region 20b.

Figure 2C:
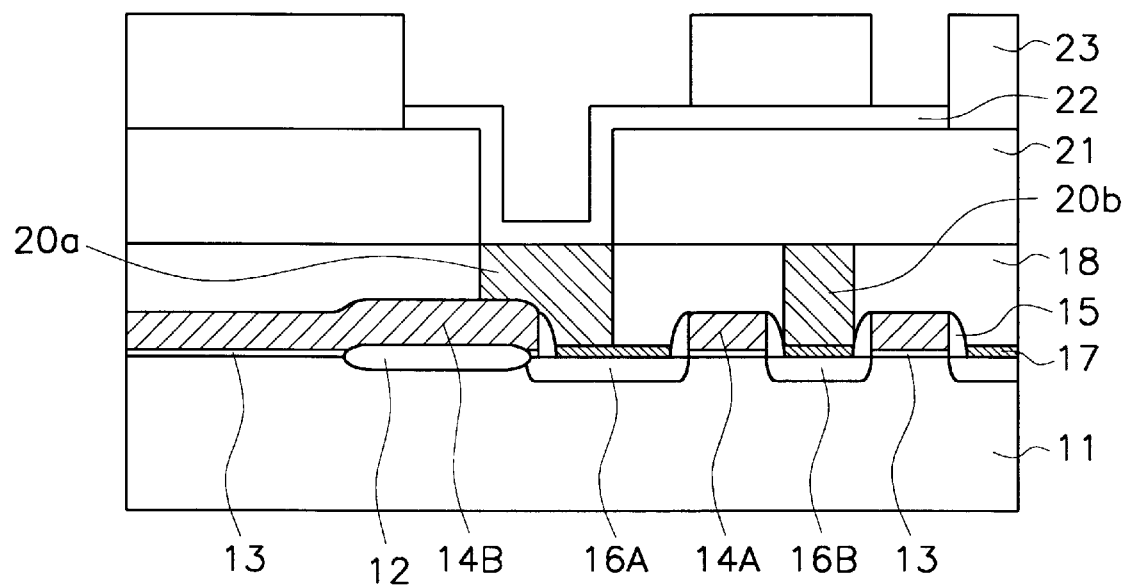

Then, as shown in FIG. 2C, a second interlayer insulating film 21 is deposited on the resulting substrate, and then patterned and etched so as to expose the plug polysilicon film 20a.

After this, an undoped third polysilicon film 22 is deposited on the patterned second interlayer insulating film 21. The third polysilicon film is then patterned and etched to form a polysilicon pattern 22a. Within the third polysilicon film, a source voltage line, a high load resistor portion and a connection line, which is connected to the polysilicon plus will be formed by subsequent processes as described below.

An insulating film 23 is then deposited on the polysilicon pattern 22a, patterned and etched to expose those portions of the polysilicon pattern 22a intended for forming the source voltage and connection lines.

Figure 2D:
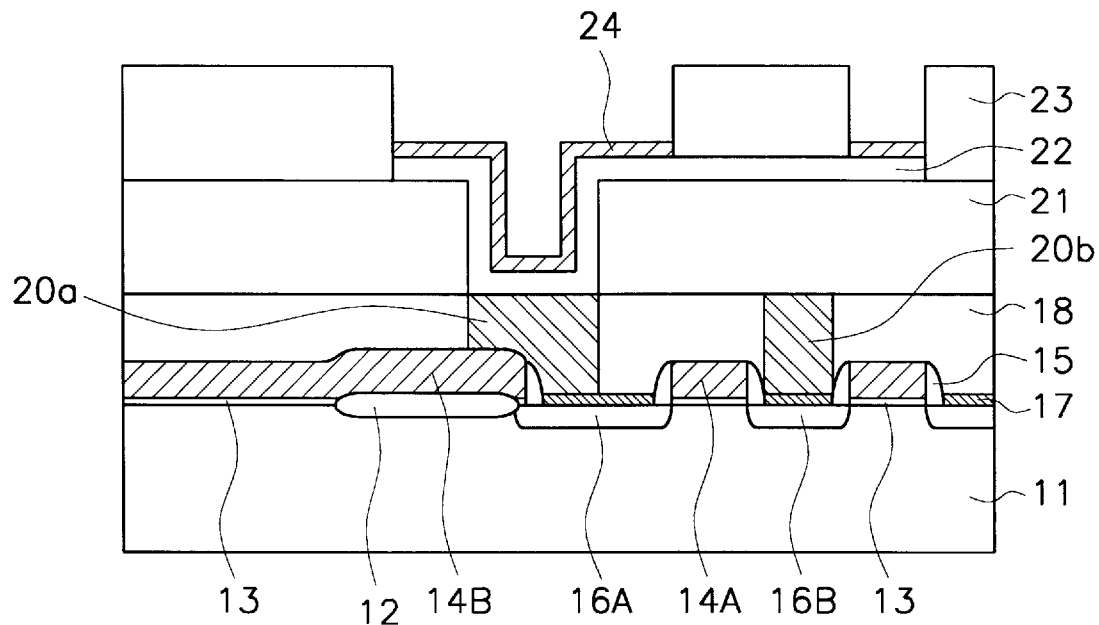

Then, as shown in FIG. 2D, a metal thin film 24 is deposited on the exposed portions of the polysilicon pattern 22. The metal thin film 24 metal is selected from the group consisting of titanium (Ti), cobalt (Co), tantalum (Ta) and nickel (Ni).

Figure 2E:
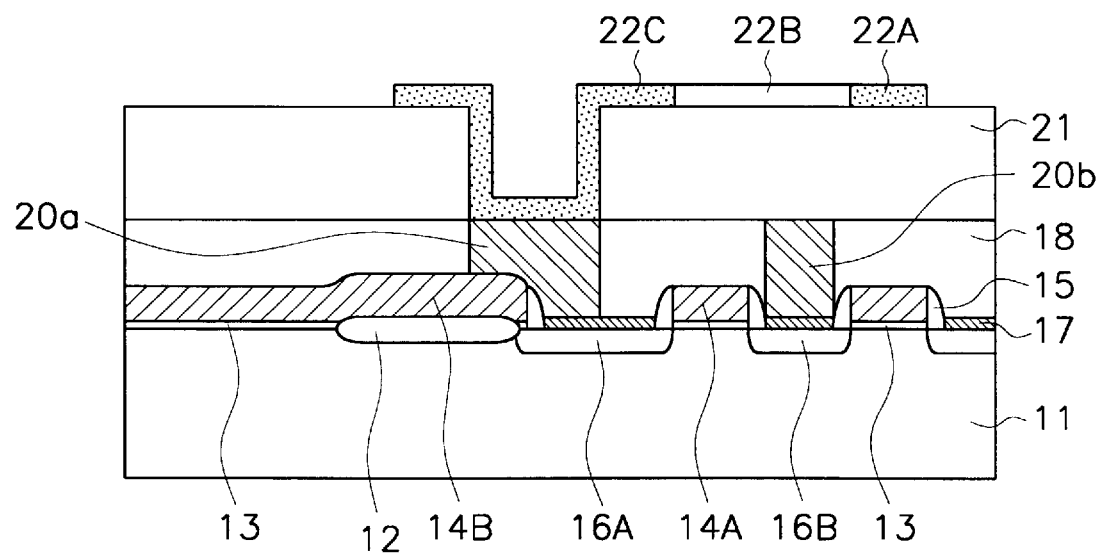

Next, as shown in FIG. 2E, the resulting substrate is subjected to a heat treatment to form a metal compound film, such as $TiSi_2$, $CoSi_2$, $TaSi_2$, or $NiSi_2$, from a reaction between the portions of the polysilicon pattern 22a and the metal thin film 24. As a result, a source voltage line 22A, a high load resistor 22B, and a connection line 22C are formed. The remaining portions of the insulating film 23 are removed to complete the SRAM device.

As those of ordinary skill will appreciate from the foregoing discussion, the method of the present invention includes forming a polysilicon plug from a second polysilicon film and then depositing a third polysilicon film to make contact with the plug polysilicon film. Then, a thin metal film of titanium (Ti), cobalt (Co) or similar metal, is deposited on portions. of the third polysilicon film to form to produce a metal compound film (silicide film) resulting from the reaction between the third polysilicon film and the thin metal film to complete the formation of the source voltage and connection lines.

The method comprising the present invention can reduce, therefore, the resistance value fluctuation resulting from the variability of the prior impurity diffusion method. In addition, because the equivalent or higher load resistance may be achieved in smaller areas, the method according to the present invention allows increased integration density of the sram device.

Although a preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a SRAM device, comprising the steps of:

providing a semiconductor substrate;

forming a gate electrode of an access transistor and a gate electrode of a drive transistor;

forming a source region and a drain region in the substrate at opposite sides of the gate electrodes, the access transistor and the drive transistor sharing a common source region;

forming a silicide film on the source region of the access transistor;

forming a first interlayer insulating film on the resulting semiconductor substrate;

etching the first interlayer insulating film to form a first opening to the drain region of the access transistor and second opening to at least a portion of the common source region;

depositing a polysilicon film;

removing the majority of the polysilicon film to form a polysilicon plug in the first opening and a bit contact buffer region in the second opening in the first interlayer insulating film;

forming a second interlayer insulating film;

etching the second interlayer insulating film to expose a portion of the polysilicon plug;

forming a third polysilicon film on the exposed portion of the polysilicon plug and the second interlayer insulating film;

forming an insulating film on the third polysilicon film;

patterning and etching the insulating film to expose portions of the third polysilicon film, the exposed portions of the third polysilicon film being those designated for the formation of a source voltage line and a connection line; and forming a metal film on the exposed portions of the third polysilicon film;

reacting the metal film with the third polysilicon film to form the source voltage line and the connection line.

2. The method of claim 1, wherein the step of reacting the metal film with the third polysilicon film comprises a thermal treatment.

3. The method of claim 2, wherein the thermal treatment comprises heating the substrate to a temperature of at least 350° C.

4. The method of claim 1, in which the second polysilicon film comprises a heavily doped polysilicon film.

5. The method of claim 4, in which the second polysilicon film comprises a polysilicon film having a dopant concentration of at least $10^{18}/cm^3$.

6. The method of claim 1, in which the metal film comprises one or more metals selected from a group consisting of Ti, Co, Ta and Ni.

7. The method of claim 1, wherein the source voltage line and the connection line comprise one or more materials selected from a group consisting of $TiSi_2$, $CoSi_2$, $TaSi_2$, and $NiSi_2$.

* * * * *